US 9,830,549 B2

(12) United States Patent
Yamamoto

(10) Patent No.: US 9,830,549 B2
(45) Date of Patent: Nov. 28, 2017

(54) DATA CARRIER AND DATA CARRIER SYSTEM

(71) Applicants: COSMONET CO., LTD, Tokyo (JP); Takeshi Yamamoto, Kyoto (JP)

(72) Inventor: Takeshi Yamamoto, Kyoto (JP)

(*) Notice: Subject to any disclaimer, the term of this patent is extended or adjusted under 35 U.S.C. 154(b) by 0 days.

(21) Appl. No.: 15/513,140

(22) PCT Filed: Sep. 22, 2014

(86) PCT No.: PCT/JP2014/075125
§ 371 (c)(1),
(2) Date: Mar. 21, 2017

(87) PCT Pub. No.: WO2016/046892
PCT Pub. Date: Mar. 31, 2016

(65) Prior Publication Data
US 2017/0300797 A1    Oct. 19, 2017

(51) Int. Cl.
*H04B 10/00* (2013.01)
*H04B 17/00* (2015.01)
(Continued)

(52) U.S. Cl.
CPC ..... *G06K 19/0728* (2013.01); *G06K 19/0772* (2013.01); *H04B 10/508* (2013.01);
(Continued)

(58) Field of Classification Search
CPC ...... H04B 10/22; H04B 10/69; H04B 10/508; G06K 19/0728; G06K 19/0772; G06K 19/07; G01R 27/28
(Continued)

(56) References Cited

U.S. PATENT DOCUMENTS 4,248,272 A * 2/1981 Wilson ................... D03D 51/28
139/353
5,451,758 A * 9/1995 Jesadanont .......... G07B 15/063
235/384
(Continued)

FOREIGN PATENT DOCUMENTS

CN            1601929 A      3/2005
CN          101194275 A      6/2008
(Continued)

OTHER PUBLICATIONS

English translation of abstracts of Publication Nos. CN1021389290A, CN101194275A, JP2000068942A, JPH0385693A, JP2008257489A, and JP2001053331A, cited in a Notice of Rejection in China.
(Continued)

*Primary Examiner* — Ken N Vanderpuye
*Assistant Examiner* — Abbas H Alagheband
(74) *Attorney, Agent, or Firm* — Ice Miller LLP

(57) ABSTRACT

A data carrier 2 is provided with a comparator 41, a capacitor 42, a comparator operation adjustment resistor 43, a resistance voltage divider circuit 44 and a reactive-current resistor 45. The capacitor 42 is disposed between the cathode of a photo-diode (PD) 21 and the minus input terminal of the comparator 41. The comparator operation adjustment resistor 43 is disposed between the plus terminal of a primary battery 271 and the minus input terminal of the comparator 41. The resistance voltage divider circuit 44 is constituted by a series connection of voltage dividing resistors 441 and 442. One end of the resistance voltage divider circuit 44 is connected to the plus terminal of the primary battery 271. The junction between the voltage division resistor 441 and the other voltage division resistor 442 is connected to the plus input terminal of the comparator 41.

7 Claims, 7 Drawing Sheets

(51) Int. Cl.
- *G06K 19/07* (2006.01)
- *G06K 19/077* (2006.01)
- *H04B 10/69* (2013.01)
- *H04B 10/508* (2013.01)
- *G01R 27/28* (2006.01)

(52) U.S. Cl.
CPC ............ *H04B 10/69* (2013.01); *G01R 27/28* (2013.01); *G06K 19/07* (2013.01); *H04B 10/22* (2013.01)

(58) Field of Classification Search
USPC .................................................... 398/118, 38
See application file for complete search history.

(56) References Cited

U.S. PATENT DOCUMENTS

| | | | | |
|---|---|---|---|---|
| 5,570,086 A | * | 10/1996 | Hanoka | G06K 7/0008 340/10.51 |
| 5,640,002 A | * | 6/1997 | Ruppert | G06K 7/0008 235/383 |
| 5,682,603 A | * | 10/1997 | Sano | G06K 7/0008 340/10.33 |
| 6,907,088 B1 | * | 6/2005 | Nakane | G06K 19/0723 329/347 |
| 8,446,254 B2 | * | 5/2013 | Carrick | G01S 5/14 340/10.1 |
| 2004/0000713 A1 | * | 1/2004 | Yamashita | A61B 5/0002 257/728 |
| 2005/0156207 A1 | * | 7/2005 | Yazawa | G01N 27/414 257/288 |
| 2006/0138209 A1 | * | 6/2006 | Schneider | G06K 7/10851 235/375 |
| 2008/0030306 A1 | * | 2/2008 | O'Toole | H03L 7/0995 340/10.4 |
| 2008/0061323 A1 | * | 3/2008 | Yazawa | G01N 27/414 257/253 |
| 2009/0258706 A1 | * | 10/2009 | Rofougaran | G01S 7/412 463/39 |
| 2010/0227558 A1 | * | 9/2010 | Sueoka | G06K 19/0707 455/41.2 |
| 2012/0087164 A1 | * | 4/2012 | Bates | G06K 19/0701 363/73 |
| 2012/0293229 A1 | * | 11/2012 | Mailand | G06G 7/14 327/306 |
| 2014/0341571 A1 | * | 11/2014 | Noda | H04B 10/504 398/38 |
| 2015/0123679 A1 | * | 5/2015 | Kuyvenhoven | G06K 19/0717 324/652 |

FOREIGN PATENT DOCUMENTS

| | | | |
|---|---|---|---|
| CN | 1021389290 A | 7/2011 | |
| JP | 03-085693 | 4/1991 | |
| JP | 385693 A | * 4/1991 | ............ G06K 19/07 |
| JP | H0385693 A | 4/1991 | |
| JP | 1995031721 | 4/1995 | |
| JP | 2000-68942 | * 3/2000 | ............ H04B 10/22 |
| JP | 2000-068942 | 3/2000 | |
| JP | 2000068942 A | 3/2000 | |
| JP | 2001-053331 | 2/2001 | |
| JP | 2001053331 A | 2/2001 | |
| JP | 2008257489 A | 10/2008 | |
| KR | 10-0715935 | 5/2007 | |
| TW | 200401458 A | 1/2004 | |
| TW | 201025884 A | 7/2010 | |
| TW | 201349770 A | 12/2013 | |

OTHER PUBLICATIONS

English translation of abstracts of Publication Nos. 7031721 and 10-0715935, cited in a Notice of Rejection in Korea.
English translation of abstracts of Publication Nos. TW200401458A, CN1601929A, TW201025884 A, and TW201349770A, cited in a Notice of Rejection in Taiwan.
Notice of Rejection issued in corresponding patent application in China.
Notice of Rejection issued in corresponding patent application in Korea.
Notice of Rejection issued in corresponding patent application in Taiwan.
PCT/JP2014/074125 International Searching Authority—Japan, International Search Report, dated Oct. 28, 2014.
PCT/JP2014/074125 International Searching Authority—Japan, Written Opinion, dated Oct. 28, 2014.

* cited by examiner

DATA CARRIER AND DATA CARRIER SYSTEM

CROSS-REFERENCE TO RELATED APPLICATION

The present application is a U.S. national stage of, and claims the priority benefit of, International Patent Application Serial No. PCT/JP2014/075125, filed Sep. 22, 2014, the text and drawings of which are hereby incorporated by reference in their entireties.

TECHNICAL FIELD

The present invention relates to a data carrier system including a data carrier and a reader-writer.

BACKGROUND ART

For example, RFID (Radio Frequency Identification) is widely known as a technique for reading and writing data from and into an IC chip incorporated in a data carrier (RF tag, IC tag, or ID tag) by performing near field radio commutation.

RFID can be roughly divided into radio wave RFID and magnetic field (electromagnetic induction) RFID depending on a method of transmitting data. In the radio wave RFID, a radio wave carrying data is exchanged between an antenna of a reader-writer and an antenna of a data carrier. In the magnetic field RFID, a coil antenna of a reader-writer and a coil antenna of a data carrier are coupled by electromagnetic induction and data is thus exchanged between the reader-writer and the data carrier.

The radio wave RFID and the magnetic field RFID each have advantages and disadvantages.

The radio wave RFID has advantages such as relatively low production cost and high versatility. Moreover, since electric power can be generated in the data carrier by rectification, the data carrier can be formed as a passive tag which needs no power supply (battery). On the other hand, the radio wave RFID has disadvantage that, when a long communication distance is set, the reader-writer communicates not only with a specific data carrier but also with data carriers in the periphery of the specific data carrier. Furthermore, the radio wave RFID tends to be affected by reflection of the radio wave on a metallic surface and absorption of the radio wave by water, and also has a problem of regulation by the radio law, a problem of interference with other radio devices, and other problems.

The magnetic field RFID has an advantage that it is less likely to be affected by dusts and the like and can be used in a poor surrounding environment. Moreover, since electric power can be generated in the data carrier by resonance, the data carrier can be formed as a passive tag, as in the radio wave RFID. On the other hand, the magnetic field RFID has disadvantages that a communication distance is short and the reader-writer and the data carrier have to be accurately positioned relative to each other for the electromagnetic induction coupling. Moreover, the magnetic field RFID has a disadvantage that, since the frequency is low, the communication speed is low.

PRIOR ART DOCUMENT

Patent Document

Patent Document 1: Japanese Patent Application Publication No. 2001-184467

SUMMARY OF THE INVENTION

Problems to be Solved by the Invention

In view of this, the inventors of the present application came up with the idea of developing an optical data carrier system including a data carrier and a reader-writer. The optical data carrier system is advantageous compared to the radio wave RFID and the magnetic field RFID in terms of communication distance, directivity, interference, and the like and is easy to handle in factory production lines and the like. Moreover, in the optical data carrier system, capacity of data exchanged between the data carrier and the reader-writer can be increased.

However, in order to send data from the data carrier to the reader-writer, a light source such as an LED mounted in the data carrier needs to be lighted, and the lighting of the LED requires a relatively large amount of power.

For example, a configuration is conceivable in which, when the communication is performed, high-intensity light is emitted from the reader-writer to the data carrier to generate power in a light receiving element (for example, a photo diode) of the data carrier, and the generated power is stored in a capacitor to be used as power to operate the data carrier. In this configuration, in the case where no primary battery is mounted in the data carrier, charging of the capacitor starts when the data carrier and the reader-writer enter a communicable area. Accordingly, it is difficult to store a large amount of power in the capacitor in a short period, and the speed of data transmission from the data carrier to the reader-writer is limited. Hence, it is preferable to mount a primary battery in a data carrier to obtain the operating power.

However, in the data carrier, during standby which is other than the time of communication with the reader-writer, a reception circuit needs to be operated to receive data from the reader-writer, and the primary battery is thus exhausted. Moreover, when direct disturbance light such as sunlight or illumination light is incident on the light receiving element during the standby, electromotive force is generated in the light receiving element and a current generated by this electromotive force flows through the primary battery. This also causes the primary battery to exhaust. Accordingly, a primary battery with a large capacity is required and the size of the data carrier increases.

An object of the present invention is to provide a data carrier and a data carrier system including the data carrier which can suppress power consumption of a power supply during standby.

Means for Solving the Problems

To achieve the above object, a data carrier in one aspect of the present invention is a data carrier which performs communication with a reader-writer by using light as a carrier wave, including: a light receiving element including a diode; a power supply configured to generate DC voltage; and a reception circuit connected to the light receiving element and the power supply, in which the reception circuit includes: a comparator; a capacitor disposed between a cathode of the light receiving element and a negative input terminal of the comparator; a comparator operation adjustment resistor disposed between a positive terminal of the power supply and the negative input terminal of the comparator; a resistance voltage divider circuit including a series circuit of a plurality of voltage dividing resistors and having one end connected to the positive terminal of the power supply, a connection point between two of the voltage dividing resistors being connected to a positive input terminal of the comparator; and a reactive-current resistor disposed between the cathode and an anode of the light receiving element, on the light receiving element side of the capacitor.

The light (light modulated based on data) carrying data is exchanged between the data carrier and the reader-writer.

The data carrier includes the reception circuit having a configuration including the comparator, the capacitor, the comparator operation adjustment resistor, the resistance voltage divider circuit, and the reactive-current resistor. The capacitor is disposed between the cathode of the light receiving element and the negative input terminal of the comparator. The comparator operation adjustment resistor is disposed between the positive terminal of the power supply and the negative input terminal of the comparator, on the comparator side of the capacitor. The resistance voltage divider circuit is formed by connecting the plurality of voltage dividing resistors in series. The one end of the resistance voltage divider circuit is connected to the positive terminal of the power supply. The connection point between one voltage dividing resistor and another voltage dividing resistor is connected to the positive input terminal of the comparator. The potential (output voltage of the resistance voltage divider circuit) of the connection point between the one voltage dividing resistor and the other voltage diving resistor is thereby inputted into the positive input terminal of the comparator as a reference voltage. The reactive-current resistor is disposed between the cathode and the anode of the light receiving element.

When no light is incident on the light receiving element, the potential (voltage of the power supply) of the negative input terminal of the comparator is equal to or higher than the potential (output voltage of the resistance voltage divider circuit) of the positive input terminal of the comparator, and a low level signal is outputted from the output terminal of the comparator.

When direct disturbance light such as sunlight and illumination light is incident on the light receiving element and no signal light from the reader-writer is incident on the light receiving element, the electromotive force is generated in the light receiving element by the direct disturbance light. Since the capacitor is disposed between the cathode of the light receiving element and the negative input terminal of the comparator, no current flows through the comparator operation adjustment resistor even when the electromotive force is generated in the light receiving element, and the current generated by the electromotive force (reactive current) flows through the reactive-current resistor. Accordingly, no power of the power supply is consumed.

Hence, it is possible to suppress power consumption of the power supply during the standby in which no signal light from the reader-writer is incident on the light emitting element.

When pulse signal light (light pulse) is outputted from the reader-writer and is incident on the light receiving element of the data carrier, the magnitude of the electromotive force generated in the light receiving element changes. A current flows through the comparator operation adjustment resistor, the capacitor, and the light receiving element depending on the change in the magnitude of the electromotive force, and the potential of the negative input terminal of the comparator changes. Then, in a period where the potential of the negative input terminal of the comparator falls below the potential of the positive input terminal, a high level signal is outputted from the output terminal of the comparator.

Accordingly, during the communication in which the signal light from the reader-writer is incident on the light emitting element, reception data (data transmitted from the reader-writer) can be obtained from the signal outputted from the output terminal of the comparator.

A data carrier in other aspects of the present invention is a data carrier which performs communication with a reader-writer by using light as a carrier wave, including: a light receiving element including a diode; a power supply configured to generate DC voltage; a comparator; an input circuit connected to one input terminal of the comparator and configured such that a potential of the input circuit changes depending on a change in a magnitude of electromotive force generated in the light receiving element; a resistance voltage divider circuit configured to step down the DC voltage of the power supply to a predetermined reference voltage and input the reference voltage into another input terminal of the comparator; and a reactive-current resistor disposed between a cathode and an anode of the light receiving element.

The light (light modulated based on data) carrying data is exchanged between the data carrier and the reader-writer.

The data carrier includes the comparator, the input circuit, the resistance voltage divider circuit, and the reactive-current resistor. The input circuit is connected to one input terminal of the comparator. The potential of the input circuit, that is the potential inputted into the one input terminal of the comparator changes depending on the change in the magnitude of the electromotive force generated in the light receiving element. The reference voltage generated by stepping down the DC voltage of the power supply to the predetermined reference voltage is inputted from the resistance voltage divider circuit into the other input terminal of the comparator. The reactive-current resistor is disposed between the cathode and the anode of the light receiving element.

When the direct disturbance light such as sunlight and illumination light is incident on the light receiving element and no signal light from the reader-writer is incident on the light receiving element, the electromotive force is generated in the light receiving element by the direct disturbance light. Since the magnitude of this electromotive force hardly changes, the potential inputted into the one input terminal of the comparator hardly changes due the function of the input circuit. Accordingly, even when the electromotive force is generated in the light receiving element, the level of the signal outputted from the output terminal of the comparator does not change from the level in state where no light is incident on the light receiving element. In this case, the current generated by the electromotive force (reactive current) flows through the reactive current resistor. Accordingly, no power of the power supply is consumed.

Hence, it is possible to suppress power consumption of the power supply during the standby in which no signal light from the reader-writer is incident on the light emitting element.

When pulse signal light (light pulse) is outputted from the reader-writer and is incident on the light receiving element of the data carrier, the magnitude of the electromotive force generated in the light receiving element changes. The potential of the negative input terminal of the comparator changes depending on the change in the magnitude of the electromotive force. Then, in a period where the potential of the negative input terminal of the comparator exceeds the potential of the positive input terminal, the level of the signal outputted from the output terminal of the comparator is inverted.

Accordingly, during the communication in which the signal light from the reader-writer is incident on the light emitting element, reception data (data transmitted from the reader-writer) can be obtained from the signal outputted from the output terminal of the comparator.

The data carrier may be such that it further includes a storage configured to store data; and a controller configured to obtain reception data from a signal outputted from the reception circuit and generate transmission data using the data stored in the storage, based on the obtained reception data.

In that case, the controller preferably includes a LSI having a CMOS structure which operates in a subthreshold region.

Causing a MOSFET to operate in the subthreshold region allows the LIS to operate on extremely-low power on the order of nA (nanoamperes). Forming the controller by using this LSI can reduce the operating power of the data carrier and particularly reduce the power consumption of the power supply during the communication.

The data carrier may be such that it further includes a light emitting element; and a drive circuit configured to supply a drive current to the light emitting element by using the DC voltage of the power supply, and the controller controls the drive current supplied from the drive circuit to the light emitting element, based on the transmission data.

In that case, a plurality of the light emitting elements are provided, and the plurality of light emitting elements are connected to the drive circuit in common and preferably emit light simultaneously by using the drive current supplied from the drive circuit.

Lighting the plurality of light emitting elements in synchronization enables the transmission data to be transmitted to the reader-writer even when foreign matters such as dust adheres to one light emitting element, by using the light emitted from another light emitting element.

The light emitting element is preferably a LED.

The LED is a point light source the pulse lighting of which can be easily controlled. Light whose intensity changes in a pulsating manner can be thus easily outputted from the light emitting element by using the LED as the light emitting element. Moreover, since the LED is a diffusing light source, the transmission from the data carrier can have relatively wide directivity. Accordingly, the transmission data can be transmitted from the data carrier to the reader-writer without the LED facing a light receiving element of the reader writer in a direction of an optical axis.

A data carrier system in another aspect of the present invention is a data carrier system including a reader-writer and a data carrier which performs communication with the reader-writer by using light as a carrier wave, in which the data carrier includes: a light receiving element including a diode; a power supply configured to generate DC voltage; and a reception circuit connected to the light receiving element and the power supply, and the reception circuit includes: a comparator; a capacitor disposed between a cathode of the light receiving element and a negative input terminal of the comparator; a comparator operation adjustment resistor disposed between a positive terminal of the power supply and the negative input terminal of the comparator, on the comparator side of the capacitor; a resistance voltage divider circuit including a series circuit of a plurality of voltage dividing resistors and having one end connected to the positive terminal of the power supply, a connection point between two of the voltage dividing resistors being connected to a positive input terminal of the comparator; and a reactive-current resistor disposed between the cathode and an anode of the light receiving element, on the light receiving element side of the capacitor.

In the configuration described above, operations and effects similar to the operation and effects described for the data carrier can be obtained.

The reader-writer may include: a reader-writer light emitting element; a reader-writer light receiving element; an intensity setter which sets the intensity of light outputted from the reader-writer light emitting element to a relatively low intensity and, when the amount of light which the reader-writer light receiving element receives from the data carrier becomes equal to or greater than a first level in the condition where the intensity of light is set to the relatively low intensity, sets the intensity of light outputted from the reader-writer light emitting element to a relatively high intensity; and a reader-writer demodulator which extracts data carried on the light received by the reader-writer light receiving element, provided that the amount of light which the reader-writer light receiving element receives from the data carrier is equal to or higher than a second level set to be lower than the first level, when the intensity of light outputted from the reader-writer light emitting element is set to the relatively high intensity.

When the light with the relatively low intensity is outputted from the reader-writer light emitting element and the reader-writer light receiving element receives, from the data carrier in response, light with a light amount equal to or higher than the first level, it is possible to determine that the data carrier has entered an area communicable with the reader-writer. Then, in the state where the data carrier is in the area communicable with the reader-writer, the light with the relatively high intensity is outputted from the reader-writer light emitting element. Moreover, when the reader-writer light receiving element receives, from the data carrier, light with a light amount equal to or higher than the second level set to be lower than the first level, the reader-writer demodulator is controlled to extract the data carried on the received light, and the reception sensitivity of the reader-writer is thereby increased. Accordingly, stable communication between the data carrier and the reader-writer can be performed.

Effects of the Invention

The present invention can suppress the power consumption of the power supply in the data carrier during the standby. Meanwhile, during the communication in which the signal light from the reader-writer is incident on the light receiving element of the data carrier, the reception data carried on the signal light can be obtained.

BRIEF DESCRIPTION OF THE DRAWINGS

FIG. 5 is a block diagram illustrating an example of a configuration of the data carrier attached to devices fixedly disposed in a factory or the like.

MODE FOR CARRYING OUT THE INVENTION

An embodiment of the present invention is described below in detail with reference to the attached drawings.

Figure 1:
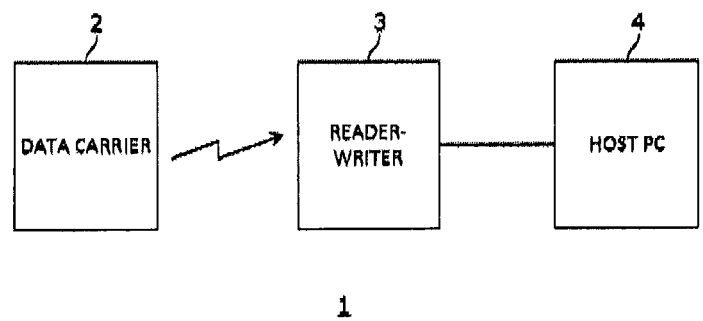
FIG. 1 is a block diagram illustrating a configuration of a data carrier system in one embodiment of the present invention.

FIG. 1 is a block diagram illustrating a configuration of a data carrier system 1 in one embodiment of the present invention.

The data carrier system 1 includes a data carrier 2 which holds data and a reader-writer 3 which writes and reads data to and from the data carrier 2. Light is used as a carrier wave in communication between the data carrier 2 and the reader-writer 3. Specifically, the data carrier system 1 is an optical data carrier system in which communication between the data carrier 2 and the reader-writer 3 is performed by using light as the carrier wave.

The data carrier system 1 is used to, for example, manage products conveyed along production lines of a factory. In this case, the data carrier 2 is attached to each of the products conveyed along the production lines of the factory, and the reader-writer 3 is disposed in each of the production lines to be fixed relative thereto. Then, when the data carrier 2 enters an area communicable with the reader-writer 3 with the conveyance of the product, the data carrier 2 and the reader-writer 3 communicate with each other and the reader-writer 3 collects information on the product which is held in the data carrier 2. The reader-writer 3 is connected to a host PC 4, and the information collected in the reader-writer 3 is transferred periodically or at a given timing from the reader-writer 3 to the host PC 4. The products conveyed along the multiple production lines can be thereby centrally managed at the host PC 4.

Figure 2:
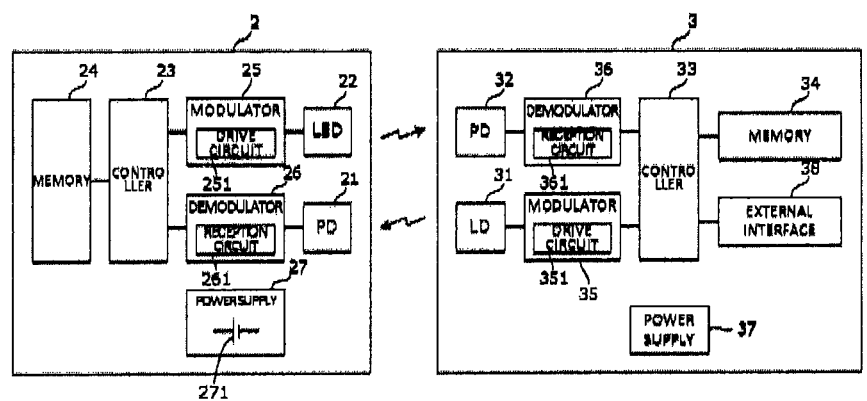
FIG. 2 is a block diagram illustrating electrical configurations of a data carrier and a reader-writer.

FIG. 2 is a block diagram illustrating electrical configurations of the data carrier 2 and the reader-writer 3.

The data carrier 2 includes a PD (photo-diode) 21, a LED 22, a controller 23, a memory 24, a modulator 25, a demodulator 26, and a power supply 27.

The controller 23 has a configuration including a CPU, and is formed of a LSI having a CMOS structure which operates in a subthreshold region. The controller 23 executes a program stored in the memory 24 to control operations of various units such as writing and reading of data to and from the memory 24.

The memory 24 is formed of, for example, a flash memory.

The modulator 25 includes a drive circuit (driver) 251 which supplies a drive current to the LED 22. When data (transmission data) is to be transmitted from the data carrier 2 to the reader-writer 3, the controller 23 controls the drive circuit 251 to pulse-light the LED 22, based on the data to be transmitted. The data is thereby transmitted by being carried on pulsed light outputted from the LED 22.

The demodulator 26 includes a reception circuit 261. The reception circuit 261 will be described later.

The power supply 27 includes a primary battery 271. The power supply 27 supplies power of the primary battery 271 to the controller 23, the memory 24, the modulator 25, and the demodulator 26. For example, a lithium manganese dioxide battery is used as the primary battery 271. Specifically, from the view point of battery capacity and size, for example, a coin lithium battery "CR2025" is used as the primary battery 271.

The reader-writer 3 includes a LD (laser diode) 31, a PD (photo-diode) 32, a controller 33, a memory 34, a modulator 35, a demodulator 36, a power supply 37, and an external interface 38.

The LD 31 is, for example, a red laser diode.

The controller 33 has a configuration including a CPU, and executes a program stored in the memory 34 to control operations of various units such as writing and reading of data to and from the memory 34.

The memory 34 is formed of, for example, a DRAM (Dynamic Random Access Memory).

The modulator 35 includes a drive circuit (driver) 351 which supplies a drive current to the LED 22. When data is to be transmitted from the reader-writer 3 to the data carrier 2, the controller 33 controls the drive circuit 351 to pulse light the LD 31, based on the data to be transmitted. The data is thereby transmitted by being carried on light outputted from the LD 31.

The demodulator 36 includes a reception circuit 361. When signal light outputted from the data carrier 2 is incident on the PD 32, electromotive force is generated in the PD 32 by a photovoltaic effect. The electromotive force in the PD 32 changes depending on the intensity of the signal light. In the reception circuit 361, a signal which switches between a high level and a low level depending on changes in the electromotive force in the PD 32 is generated. This signal is outputted from the reception circuit 361 to the controller 33. In the controller 33, the signal outputted from the reception circuit 361 is converted into data and the data is obtained as reception data from the data carrier 2.

The power supply 37 supplies power to the controller 33, the memory 34, the modulator 35, and the demodulator 36. For example, the power supply 37 may include an internal battery as a power source or include a circuit which generates operating power for the units in the reader-writer 3 from an external power supply (for example, commercial AC power supply, USB bus power, and the like).

The external interface 38 is an interface for performing communication with the host PC 4 (see FIG. 1). For example, an USB (Universal Serial Bus) interface is used as the external interface 38.

Figure 3:
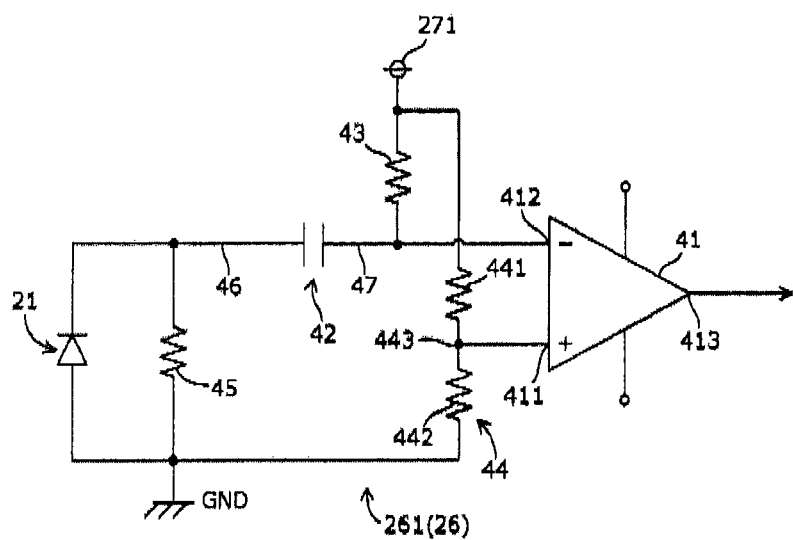
FIG. 3 is a circuit diagram illustrating a configuration of a reception circuit of the data carrier.
Figure 4:
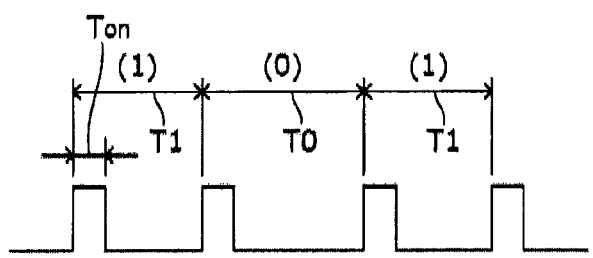
FIG. 4 is a diagram for explaining a relationship between data (codes) and an output mode of light from the reader-writer (output mode of signals from an output terminal of a comparator).

FIG. 3 is a circuit diagram illustrating a configuration of the reception circuit 261 (demodulator 26) of the data carrier 2. FIG. 4 is a diagram for explaining a relationship between the data (codes) and an output mode of the light from the reader-writer 3 (output mode of signals from an output terminal of a comparator).

The reception circuit 261 includes a comparator 41, a capacitor 42, a comparator operation adjustment resistor 43, a resistance voltage divider circuit 44, and a reactive-current resistor 45.

The comparator 41 has a positive input terminal 411, a negative input terminal 412, and an output terminal 413.

The capacitor 42 is disposed between a cathode of the PD 21 and the negative input terminal 412 of the comparator 41. Specifically, one electrode of the capacitor 42 is connected the cathode of the PD 21 via a wire 46. The other electrode of the capacitor 42 is connected to the negative input terminal 412 of the comparator 41 via a wire 47.

One end of the comparator operation adjustment resistor 43 is connected to a positive terminal of the primary battery 271 in the power supply 37. The other end of the comparator operation adjustment resistor 43 is connected to the wire 47. In other words, the comparator operation adjustment resistor 43 is disposed between the positive terminal of the primary battery 271 and the negative input terminal 412 of the comparator 41.

The output terminal 413 of the comparator 41 is connected to the controller 23.

The resistance voltage divider circuit 44 is formed by connecting two voltage dividing resistors 441 and 442 in series. One end of the resistance voltage divider circuit 44 is connected the positive terminal of the primary battery 271. A connection point 443 between the voltage dividing resistors 441 and 442 is connected to the positive input terminal 411 of the comparator 41. The other end of the resistance voltage divider circuit 44 and an anode of the PD 21 are connected to the ground (GND).

Note that the resistance voltage divider circuit 44 may be formed by connecting three or more voltage dividing resistors in series.

The reactive-current resistor 45 is disposed between the cathode and the anode of the PD 21. Specifically, one end of the reactive-current resistor 45 is connected to the wire 46. The other end of the reactive-current resistor 45 is connected to the ground.

When no light is incident on the PD 21, no electromotive force is generated in the PD 21 by direct disturbance light and no current flows through the wire 46 connected to the cathode of the PD 21. Thus, no current flows through the wire 47 connected to the wire 46 via the capacitor 42. Accordingly, the potential of the wire 47 is the same as the potential of the positive terminal of the primary battery 271 in the power supply 37. Meanwhile, a current flows through the resistance voltage divider circuit 44. A resistor with a relatively large resistance value is used as the voltage dividing resistor 442 on the negative side of the resistance voltage divider circuit 44, and the current flowing through the resistance voltage divider circuit 44 is a micro-current of, for example, about 100 nA. Voltage equal to a difference between the electromotive force of the primary battery 271 and an amount of fall of the potential in the voltage dividing resistor 441 on the positive side is supplied to the positive input terminal 411 of the comparator 41. Accordingly, the potential of the negative input terminal 412 of the comparator 41 is higher than the potential of the positive input terminal 411, and a low-level signal is outputted from the output terminal of the comparator 41.

When the direct disturbance light such as sunlight and illumination light is incident on the PD 21 and no signal light from the reader-writer 3 is incident on the PD 21, the electromotive force (DC power) is generated in the PD 21 by the direct disturbance light. At this time, a current flows through the wire 46 connected to the cathode of the PD 21. However, since the capacitor 42 is disposed between the cathode of the PD 21 and the negative input terminal 412 of the comparator 41, no current flows through the wire 47 even when the electromotive force is generated in the PD 21 by the direct disturbance light. Accordingly, the potential of the negative input terminal 412 of the comparator 41 is higher than the potential of the positive input terminal 411, and a low level signal is outputted from the output terminal of the comparator 41. The current (reactive current) flowing through the wire 46 flows through the reactive current resistor 45.

As described above, during standby in which no signal light from the reader-writer 3 is incident on the PD 21 and no communication is performed between the data carrier 2 and the reader-writer 3, no current flows through the wire 46. Thus, the power of the primary battery 271 in the power supply 37 is consumed only by the micro-current flowing through the resistance voltage divider circuit 44. Accordingly, the configuration of the reception circuit 261 can suppress the power (power of the power supply) consumption of the primary battery 271 during the standby in which no signal light from the reader-writer is incident on the PD 21. As a result, the life of the primary battery 271 can be extended.

In the reader-writer 3, the intensity of the light outputted from the LD 31 is set to a relatively low intensity during the standby, that is a state which is before the data carrier 2 attached to each of the products conveyed along the production lines enters the area communicable with the reader-writer 3. Moreover, the controller 33 controls the drive circuit 351 of the modulator 35 such that a communication start command instructing start of the communication is repeatedly transmitted by being carried on the low-intensity light outputted from the LD 31.

The communication start command is data expressed by a string (bit string) of "1" and "0." Data "1" and "0" are transmitted by utilizing long and short time intervals between one lighting operation of the LD 31 and the next lighting operation of the LD 31, with a lighting time Ton in each lighting operation of LD 31 being fixed. For example, the data "1" is transmitted by lighting the LED 31 and then lighting it again after an elapse of a relatively short time T1. Meanwhile, the data "0" is transmitted by lighting the LED 31 and then lighting it again after an elapse of a relatively long time T0.

When the data carrier 2 enters the area communicable with the reader-writer 3, the light (signal light) carrying the communication start command enter the PD 21 of the data carrier 2. When the signal light from the reader-writer 3 enter incident on the PD 21 of the data carrier 2, the magnitude of the electromotive force generated in the PD 21 changes. A current flows through the comparator operation adjustment resistor 43, the capacitor 42, and the PD 21 depending on the change in the magnitude of the electromotive force, and the potential of the negative input terminal 412 of the comparator 41 changes. Then, in a period where the potential of the negative input terminal 412 of the comparator 41 falls below the potential of the positive input terminal 411, a high level signal is outputted from the output terminal 413 of the comparator 41.

In the controller 23, data (codes) is decoded from the signals outputted from the output terminal 413 of the comparator 41.

Specifically, when the high level signal is outputted from the output terminal 413 of the comparator 41 in a state where no communication is started between the data carrier 2 and the reader-writer 3, the controller 23 starts decoding the signals outputted from the output terminal 413 of the comparator 41 into data and continues decoding the signals until the low level signal is outputted from the output terminal 413 for a certain time longer than the time T0. When the time from the output of one high level signal from the output terminal 413 of the comparator 41 to the output of the next high level signal is the relatively short time T1, the controller 23 obtains the data "1." Meanwhile, when the time from the output of one high level signal from the output terminal 413 of the comparator 41 to the output of the next high level signal is the relatively long time T0, the controller 23 obtains the data "0."

Then, the controller 23 determines whether an obtained bit string is a string corresponding to the communication start command.

When the bit string is the string corresponding to the communication start command, the controller 23 determines that the data carrier 2 has received the communication start command from the reader-writer 3. In this case, the controller 23 controls the drive circuit 251 of the modulator 25 to pulse-light the LED 22 such that communication approval data indicating approval of communication is transmitted by being carried on the light outputted from the LED 22.

When the light carrying the communication approval data is incident on the PD 32 of the reader-writer 3, in the reader-writer 3, the controller 33 obtains the communication approval data from the signal outputted from the reception circuit 361 of the demodulator 36.

For example, the reception circuit 361 is provided with two comparators with different sensitivities (reference voltages) which are arranged in parallel. Assume a case where the reader-writer 3 receives the light carrying the communication approval data. In this case, if no communication approval data is obtained from the signal outputted by the comparator with a relatively low sensitivity (for example, a comparator to which a relatively low reference voltage is inputted, in a configuration in which reference voltages are inputted into a positive input terminal), the communication between the data carrier 2 and the reader-writer 3 is not started even when the communication approval data is obtained from the signal outputted by the comparator with the relatively high sensitivity. When the communication approval data is obtained from the signal outputted by the comparator with the relatively low sensitivity, the communication between the data carrier 2 and the reader-writer 3 is started.

When the communication between the data carrier 2 and the reader-writer 3 is started, the reader-writer 3 changes the intensity of the light outputted from the LD 31 to a relatively high intensity to perform stable communication with the data carrier 2.

Thereafter, the controller 33 controls the drive circuit 351 of the modulator 35 such that a transmission requesting command requesting the data carrier 2 to transmit predetermined data is transmitted by being carried on the light outputted from the LD 31.

When the light carrying the transmission requesting command is incident on the PD 21 of the data carrier 2, as in the case of the communication start command described above, the controller 23 decodes signals outputted from the output terminal 413 of the comparator 41 into data. The transmission requesting command is obtained by this decoding. In response to the obtaining of the transmission requesting command, the controller 23 reads the predetermined data from the memory 24. Then, the controller 23 controls the drive circuit 251 of the modulator 25 to pulse-light the LED 22 such that the predetermined data read from the memory 24 is transmitted by being carried on the light outputted from the LED 22.

When the light carrying the predetermined data is incident on the PD 32 of the reader-writer 3, in the reader-writer 3, the controller 33 obtains the predetermined data from a signal outputted from the reception circuit 361 of the demodulator 36. Then, the controller 33 writes the predetermined data into the memory 34.

After the communication between the data carrier 2 and the reader-writer 3 is started, for example, data is obtained from signals outputted by the comparator with the relatively high sensitivity. The reader-writer 3 can thus obtain data carried on the light from the data carrier 2 in an excellent manner even when the light from the data carrier 2 has a very low intensity.

Thereafter, the controller 33 controls the drive circuit 351 of the modulator 35 such that a communication termination command indicating termination of the communication with the data carrier 2 is transmitted by being carried on the light outputted from the LD 31.

When the light carrying the communication termination command is incident on the PD 21 of the data carrier 2, the controller 23 decodes signals outputted from the output terminal 413 of the comparator 41 into data and obtains the communication terminal command. In response to the obtaining of the communication terminal command, the communication between the data carrier 2 and the reader-writer 3 is terminated.

Note that, although it is described that, after the start of the communication between the data carrier 2 and the reader-writer 3, the intensity of the light outputted from the LD 31 can be switched from the relatively low intensity to the relatively high intensity, the intensity of the light outputted from the LD 31 may be the same before and after the start of the communication between the data carrier 2 and the reader-writer 3.

Moreover, although it is described that the reception circuit 361 of the demodulator 36 in the reader-writer 3 is provided with the two comparators with different sensitivities which are arranged in parallel, the number of comparators provided in the reception circuit 361 may be one.

The configuration may be such that a comparator with a higher sensitivity than the comparator 41 is provided parallel to the comparator 41 in the reception circuit 261 of the demodulator 26 in the data carrier 2 and, after the communication between the data carrier 2 and the reader-writer 3 is started, the data is obtained from a current outputted by this comparator with the higher sensitivity. This allows the data carrier 2 to obtain data carried on a signal light incident on the PD 21 of the data carrier 2 (light outputted from the reader-writer 3) in an excellent manner even when the signal light has very low intensity.

In the data carrier 2, the controller 23 is formed of the LSI having the CMOS structure which operates in the subthreshold region. This can reduce the operating power of the controller 23 and suppress power consumption of the primary battery 271 in the operation of the controller 23. As a result, the life of the primary battery 271 can be further extended.

The LED 22 is a point light source the pulse lighting of which can be easily controlled. In the data carrier 2, since the LED 22 is used as a light emitting element, light whose intensity changes in a pulsating manner can be easily outputted. Moreover, since the LED 22 is a diffusing light source, the transmission from the data carrier 2 can have relatively wide directivity. Accordingly, the transmission data can be transmitted from the data carrier 2 to the reader-writer 3 without the LED 22 facing the PD 32 of the reader-writer 3 in a direction of an optical axis.

Although one embodiment of the present invention is described above, the present invention can be carried out in other embodiments.

For example, in the aforementioned embodiment, description is given of the case where the data carrier 2 is attached to moving bodies such as products conveyed along production lines. However, the data carrier 2 may be attached to devices fixedly disposed in a factory or the like and be used to store and hold the conditions of the devices.

Figure 5:
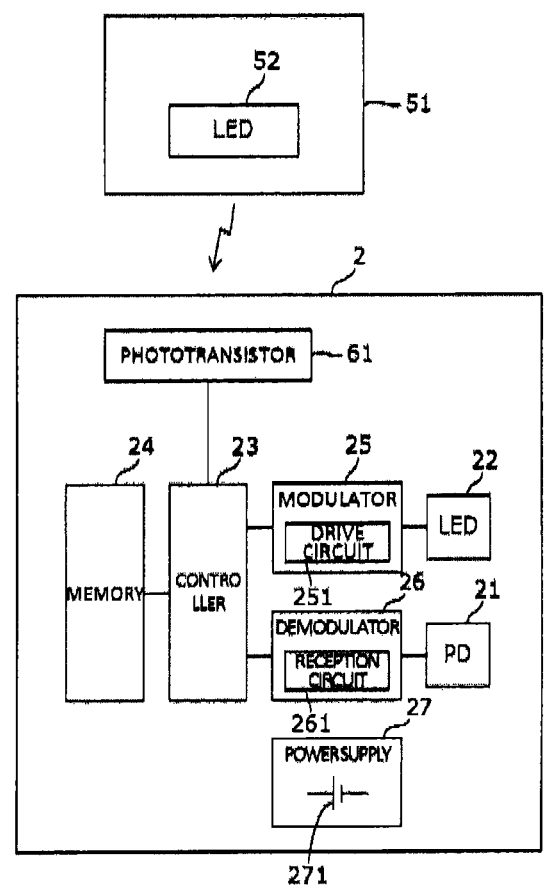

FIG. 5 is a block diagram illustrating an example of a configuration of the data carrier 2 attached to devices fixedly disposed in a factory or the like.

As illustrated in FIG. 5, a detector 51 configured to detect the condition of the device to which the data carrier 2 is attached is attached to the device. The detector 51 includes a LED 52, and the data carrier 2 includes a phototransistor 61 forming a photo-coupler with the LED 52. When the condition of the device is detected by the detector 51, the condition of the device is transmitted from the detector 51 to the data carrier 2 by converting an electric signal indicating the condition of the device to light between the LED 52 and the phototransistor 61 and then reconverting the light to the electric signal. When the data carrier 2 receives the condition of the device, the controller 23 writes the received condition of the device into the memory 24.

Examples of the condition of the device include the temperature of the device, the temperature and/or humidity of an environment in which the device is used, the number of times the device performs an operation (for example, the number of times of pressing in a pressing device), the numbers of good products and/or defective products produced by the device, and the like.

Storing and holding the condition of the device in the data carrier 2 enables the following operation. For example, when a failure occurs or a failure rate increases in the device, it is possible to read the condition of the device from the data carrier 2 by using the reader-writer 3 and use the read information to analyze the cause of the failure and take measures against the failure. As a result, the quality of products can be improved.

Moreover, in the case where the data carrier 2 is to be attached to a device fixedly disposed in a factory or the like, the data carrier 2 may include a configuration for detecting the condition of the device.

Figure 6:
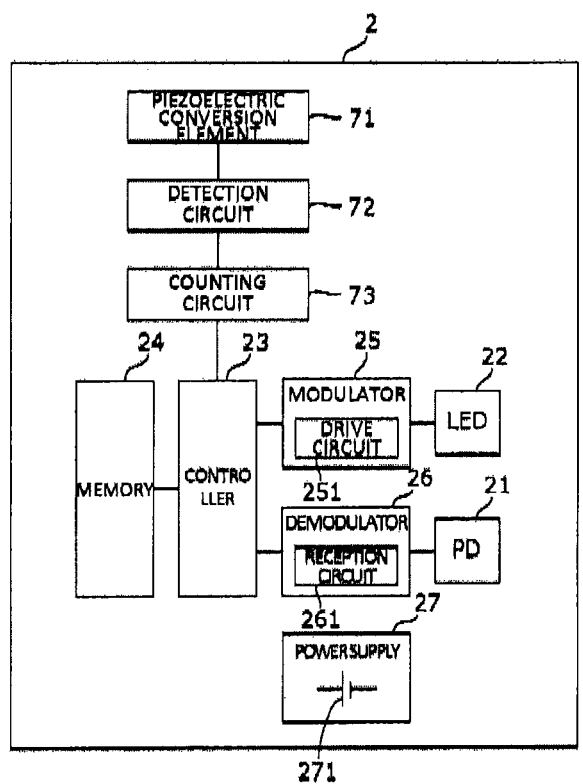
FIG. 6 is a block diagram illustrating an example of a configuration of a data carrier attached to a pressing device used for work of crimping a wire harness terminal.

Assume a case where the data carrier 2 is attached to a pressing device used for work of crimping a wire harness terminal. In this case, as illustrated in FIG. 6, the data carrier 2 includes, for example, a piezoelectric conversion element (piezoelectric element) 71, a detection circuit 72 which detects a unique vibration occurring when an applicator moves up and down, from a signal outputted from the piezoelectric conversion element 71, and a counting circuit 73 which counts the number of times the detection circuit 72 detects the unique vibration. The number counted by the counting circuit 73 is inputted into the controller 23 and the controller 23 writes the number into the memory 24.

In this configuration, the life (durable period) of a consumable used in the pressing device can be managed in an excellent manner by reading the number (used number) stored and held in the memory 24 of the data carrier 2 with the reader-writer 3.

Figure 7:
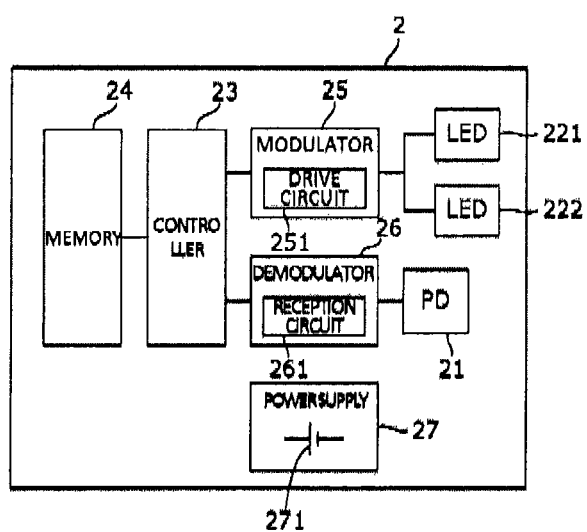
FIG. 7 is a block diagram illustrating a configuration of a data carrier including multiple light emitting elements (LED).

Moreover, the data carrier 2 may include multiple light emitting elements. For example, as illustrated in FIG. 7, the data carrier 2 may include two LEDs 221 and 222. In this case, the transmission data is preferably carried on light outputted from each of the LEDs 221 and 222 by pulse-lighting the two LEDs 221 and 222 in synchronization. In this configuration, even when foreign matters such as dust adheres to one LED 221, the transmission data can be transmitted to the reader-writer 3 by the light emitted from the other LED 222.

Moreover, data may be transmitted to the data carrier 2 by the reader-writer 3 and written into the memory 24 of the data carrier 2. For example, in a case where the device to which the data carrier 2 is attached includes a member requiring calibration, when the calibration is performed, the date and time of the calibration or timing at which the next calibration is to be performed may be written into the memory 24 of the data carrier 2. Moreover, in a case where the device to which the data carrier 2 is attached includes a member requiring replacement, when the replacement is performed, the date and time of the replacement or timing at which the next replacement is to be performed may be written into the memory 24 of the data carrier 2. This enables obtaining of time to the calibration timing or the replacement timing by reading the information on the calibration timing or the replacement timing, together with the information on the condition of the device and the like, from the data carrier 2 by using the reader-writer 3.

Although the embodiments of the present invention have been described in detail, the embodiments are merely specific examples used to clarify the technical contents of the present invention. The present invention should not be understood to be limited to these specific examples, and the sprit and scope of the present invention are limited only by the attached claims.

For example, it is described that the light emitting element of the reader-writer 3 is the LD (laser diode) 31 formed of the red laser diode. The light emitting element of the reader-writer 3 is not limited to this and may be a laser diode which outputs laser light of color other than red. Moreover, the light emitting element of the reader-writer 3 is not limited to the laser diode and may be a LED. The LED may be a red LED or an infrared LED.

For example, when the reader-writer 3 is a long-distance handy type reader-writer which is operated at a position relatively far away from the data carrier 2, the red laser is preferably used as the light emitting element of the reader-writer 3. Using the red laser allows a user to visually recognize that the laser light outputted from the reader-writer 3 is casted on the data carrier 2. When the reader-writer 3 is a short-distance handy type reader-writer which is operated at a position relatively close to the data carrier 2 or a fixed type reader-writer which is fixedly disposed, the red LED or the infrared LED may be used as the light emitting element of the reader-writer 3. For example, the short-distance handy type reader-writer 3 may use the red LED and the fixed type reader-writer 3 may use the infrared LED.

Other various design changes can be made on the configurations described above within a scope of matters described in the claims.

EXPLANATION OF THE REFERENCE NUMERALS

1 data carrier system
2 data carrier
3 reader-writer
21 PD (light receiving element)
22 LED (light emitting element)
23 controller
24 memory (storage)
25 modulator
26 demodulator
27 power supply
41 comparator
42 capacitor (input circuit)
43 comparator operation adjustment resistor
44 resistance voltage divider circuit
45 reactive-current resistor
46 wire (input circuit)
221 LED (light emitting element)
222 LED (light emitting element)
251 drive circuit
261 reception circuit
271 primary battery
411 positive input terminal
412 negative input terminal 441 voltage dividing resistor
442 voltage dividing resistor
443 connection point

The invention claimed is:

1. A data carrier which performs communication with a reader-writer by using light as a carrier wave, comprising:
   a light receiving element including a diode;
   a power supply configured to generate DC voltage; and
   a reception circuit connected to the light receiving element and the power supply, wherein
   the reception circuit includes:
      a comparator;
      a capacitor disposed between a cathode of the light receiving element and a negative input terminal of the comparator;
      a comparator operation adjustment resistor disposed between a positive terminal of the power supply and the negative input terminal of the comparator, on the comparator side of the capacitor;
      a resistance voltage divider circuit including a series circuit of a plurality of voltage dividing resistors and having one end connected to the positive terminal of the power supply, a connection point between two of the voltage dividing resistors being connected to a positive input terminal of the comparator; and
      a reactive-current resistor disposed between the cathode and an anode of the light receiving element, on the light receiving element side of the capacitor.

2. A data carrier which performs communication with a reader-writer by using light as a carrier wave, comprising:
   a light receiving element including a diode;
   a power supply configured to generate DC voltage;
   a comparator;
   an input circuit connected to one input terminal of the comparator and configured such that a potential of the input circuit changes depending on a change in a magnitude of electromotive force generated in the light receiving element;
   a resistance voltage divider circuit configured to step down the DC voltage of the power supply to a predetermined reference voltage and input the reference voltage into another input terminal of the comparator; and
   a reactive-current resistor disposed between a cathode and an anode of the light receiving element.

3. The data carrier according to claim 1, further comprising:
   a storage configured to store data; and
   a controller configured to obtain reception data from a signal outputted from the reception circuit and generate transmission data using the data stored in the storage, based on the obtained reception data.

4. The data carrier according to claim 3, wherein the controller includes a LSI having a CMOS structure which operates in a subthreshold region.

5. The data carrier according to claim 4, further comprising:
   a light emitting element; and
   a drive circuit configured to supply a drive current to the light emitting element by using the DC voltage of the power supply, wherein
   the controller controls the drive current supplied from the drive circuit to the light emitting element, based on the transmission data.

6. The data carrier according to claim 5, wherein
   a plurality of the light emitting elements are provided, and
   the plurality of light emitting elements are connected to the drive circuit in common and simultaneously emit light by using the drive current supplied from the drive circuit.

7. A data carrier system comprising a reader-writer and a data carrier which performs communication with the reader-writer by using light as a carrier wave, wherein
   the data carrier includes:
      a light receiving element including a diode;
      a power supply configured to generate DC voltage; and
      a reception circuit connected to the light receiving element and the power supply, and
   the reception circuit includes:
      a comparator;
      a capacitor disposed between a cathode of the light receiving element and a negative input terminal of the comparator;
      a comparator operation adjustment resistor disposed between a positive terminal of the power supply and the negative input terminal of the comparator, on the comparator side of the capacitor;
      a resistance voltage divider circuit including a series circuit of a plurality of voltage dividing resistors and having one end connected to the positive terminal of the power supply, a connection point between two of the voltage dividing resistors being connected to a positive input terminal of the comparator; and
      a reactive-current resistor disposed between the cathode and an anode of the light receiving element, on the light receiving element side of the capacitor.

* * * * *